(12) United States Patent
Kim

(10) Patent No.: US 7,670,926 B2
(45) Date of Patent: Mar. 2, 2010

(54) METHOD FOR FORMING SHALLOW TRENCH ISOLATION UTILIZING TWO FILLING OXIDE LAYERS

(75) Inventor: Wan Shick Kim, Yongin-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 8 days.

(21) Appl. No.: 11/319,696

(22) Filed: Dec. 29, 2005

(65) Prior Publication Data
US 2006/0145287 A1 Jul. 6, 2006

(30) Foreign Application Priority Data
Dec. 30, 2004 (KR) .................. 10-2004-0117500

(51) Int. Cl.
*H01L 21/762* (2006.01)
*H01L 29/00* (2006.01)
(52) U.S. Cl. .............. 438/433; 438/435; 257/E21.546; 257/E21.551
(58) Field of Classification Search ............... 438/424, 438/433–435, 524; 257/E21.546, 551
See application file for complete search history.

(56) References Cited

U.S. PATENT DOCUMENTS

| | | | | |
|---|---|---|---|---|
| 5,413,953 A | * | 5/1995 | Chien et al. | 438/443 |
| 5,795,811 A | * | 8/1998 | Kim et al. | 438/404 |
| 6,150,237 A | * | 11/2000 | Lee | 438/433 |
| 6,828,239 B2 | * | 12/2004 | En-Ho et al. | 438/700 |
| 6,946,359 B2 | * | 9/2005 | Yang et al. | 438/425 |
| 7,033,908 B2 | * | 4/2006 | Cha et al. | 438/435 |
| 2003/0013271 A1 | * | 1/2003 | Knorr et al. | 438/435 |
| 2004/0203216 A1 | * | 10/2004 | Lin et al. | 438/424 |

\* cited by examiner

*Primary Examiner*—Anh D Mai
(74) *Attorney, Agent, or Firm*—Lowe Hauptman Ham & Berner LLP

(57) ABSTRACT

A method for forming shallow trench isolation in a semiconductor device. The method includes forming a trench in a predetermined depth on a semiconductor substrate, filling the trench with a first filing oxide, injecting an impurity into a portion of the first filling oxide inside the trench, removing the portion of the first filling oxide by wet etching, and filling the trench with a second filling oxide.

9 Claims, 3 Drawing Sheets

METHOD FOR FORMING SHALLOW TRENCH ISOLATION UTILIZING TWO FILLING OXIDE LAYERS

This application claims the benefit of Korean Application No. 10-2004-0117500, filed with the Korean Intellectual Property Office on Dec. 30, 2004, which is incorporated by reference herein in its entirety.

BACKGROUND OF THE INVENTION

1. Field of the Invention

The present invention relates generally to a semiconductor device manufacturing technology, and particularly to a method for forming shallow trench isolation in a semiconductor device.

2. Description of the Related Art

Manufacturing processes for making a highly integrated semiconductor device requires forming a variety of components, such as a transistor, capacitor, metal wiring, etc., in very restricted regions, and forming highly insulated regions to prevent parasitic current leakage between the components.

Conventionally, a local oxidation of silicon (LOCOS) field oxide, formed by oxidizing a silicon substrate, has been widely used for electrically isolating the components of the semiconductor device. However, according to the increase of the integration density, a LOCOS field oxide has become disadvantageous to the formation of integrated circuits, because it generally includes a "bird's beak," which may invade an active device region. Accordingly, a lot of alternative isolation technologies, more advantageous to the higher integration of devices, have been developed. As a typical example of such alternative isolation technologies, shallow trench isolation (STI) having a superior insulating performance and a relatively small formation area has been widely used for isolating transistors in metal oxide semiconductor field effect transistor (MOSFET) and bipolar junction transistor devices, since approximately the 0.5 micrometer (μm) technology node.

Hereinafter, a conventional STI process will be described with reference to FIG. 1.

First, a pad oxide 22 and a pad nitride 24 are formed on a silicon substrate 10 in successive order, then a moat pattern is formed thereon by photolithography and etching processes. The pad nitride 24 and the pad oxide 22 are partially etched in successive order, using the moat pattern as an etching mask. Subsequently, exposed portions of the substrate 10 are etched in a predetermined depth so that trenches 20 are formed around an active device area.

After the trench etch, a liner oxide (not shown) can be formed in each trench 20 to protect a trench sidewall, i.e., an inside surface of the silicon substrate 10 exposed by trench 20. Then, trenches 20 are filled with a filling oxide 20a. Here, the filling oxide 20a can be deposited by chemical vapor deposition (CVD) using $O_3$-TEOS (Tetra Ethyl Ortho Silicate) oxidation film or high-density plasma chemical vapor deposition (HDP-CVD). Next, the substrate 10 is planarized via chemical and mechanical polishing (CMP) so that the filling oxide covering the active device area is selectively removed for device processing to continue. Finally, the pad nitride 24 and pad oxide 22 are removed by wet etching, thus resulting in a highly planar substrate with isolated device regions.

Referring to FIG. 1, even though $O_3$-TEOS CVD or HDP-CVD having a relatively superior gap-filling ability is used, the filling oxide 20a inside trenches 20 can include voids 21a or seams 21b. The voids 21a and seams 21b can produce or result in problems such as a gate line bridge, etc., because they can emerge during CMP and wet etching processes. As a result, the voids 21a and seams 21b may deteriorate the insulating performance of the STI. In order to solve such problems, it can be considered to decrease a slope of the trench 20 or remove the pad nitride 24 in a predetermined width before formation of the filling oxide.

However, in case the width of the trench 20 is considerably narrow, especially in the sub-90 nanometer (nm) technologies, there is the limit of decreasing the slope of the trench 20. Excessive decreasing of the slope of trench 20 may result in defects (e.g., dislocations) in the silicon substrate 10, thus deteriorating the yield of semiconductor devices. In addition, the widening of the width of the trench entrance by removing a portion of the pad nitride 24 may result in problems where the active device region is decreased and a remaining portion of the pad nitride 24 peels off during the wet etching.

SUMMARY OF THE INVENTION

It is, therefore, an object of the present invention to provide a method for forming shallow trench isolation with no defects, such as voids and seams, thus enabling improvement of the insulating performance of the shallow trench isolation.

The present invention can overcome the processing limits of $O_3$-TEOS CVD or HDP-CVD, which are generally used for filling the isolation trench with an oxide, and improve the performance and yield of semiconductor devices, particularly those fabricated with a design rule of 90 nm or less.

To achieve the above objects, an embodiment of a method for forming shallow trench isolation in a semiconductor device, according to the present invention, comprises the steps of: (a) forming a trench in a predetermined depth on a semiconductor substrate; (b) filling the trench with a first filing oxide; (c) injecting an impurity into a portion of the first filling oxide inside the trench; (d) removing the portion of the first filling oxide by wet etching; and (e) filling the trench with a second filling oxide.

The semiconductor substrate can be a silicon substrate, and the first and second filling oxides can be formed of a silicon oxide, especially by $O_3$-TEOS CVD or HDP CVD. In addition, the impurity injected into the portion of the first filling oxide is preferably any one selected from the group consisting of phosphorus (P), boron (B), and argon (Ar).

These and other aspects of the present invention will become evident by reference to the following description of the invention, often referring to the accompanying drawings.

DETAILED DESCRIPTION OF THE INVENTION

Figure 1:
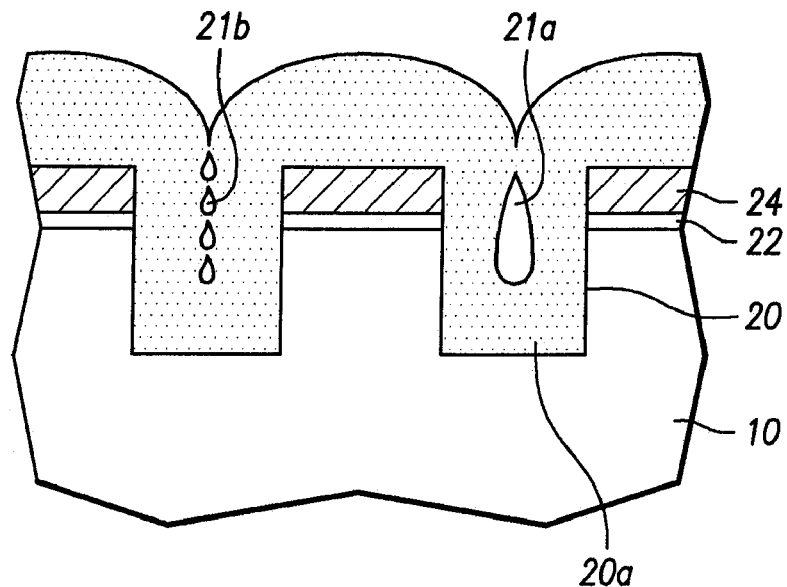
FIG. 1 is a cross-sectional view of a conventional shallow trench isolation structure.
Figure 2A:
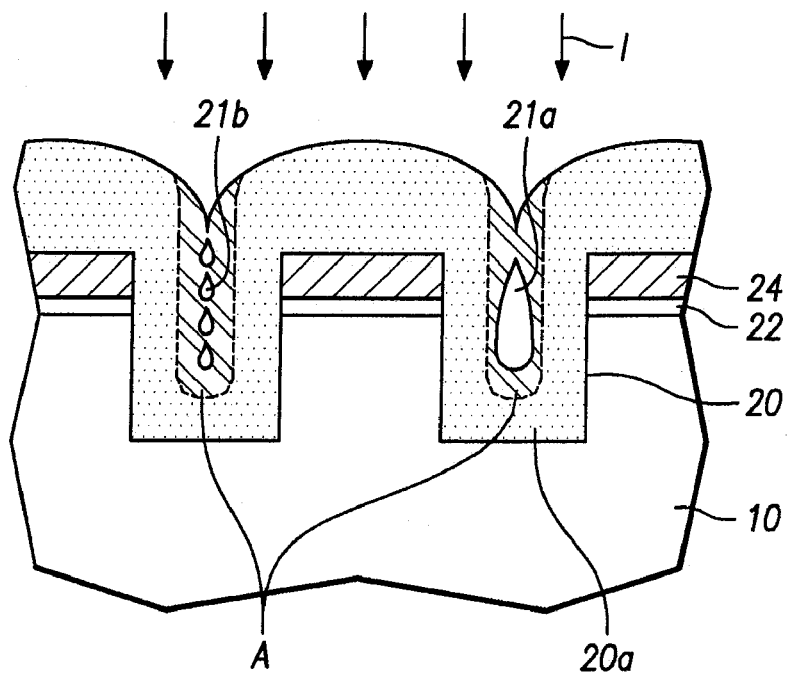
FIGS. 2A to 2C are a series of cross-sectional views of a shallow trench isolation structure according to the present invention, illustrating a process for forming the structure.
Figure 2A:
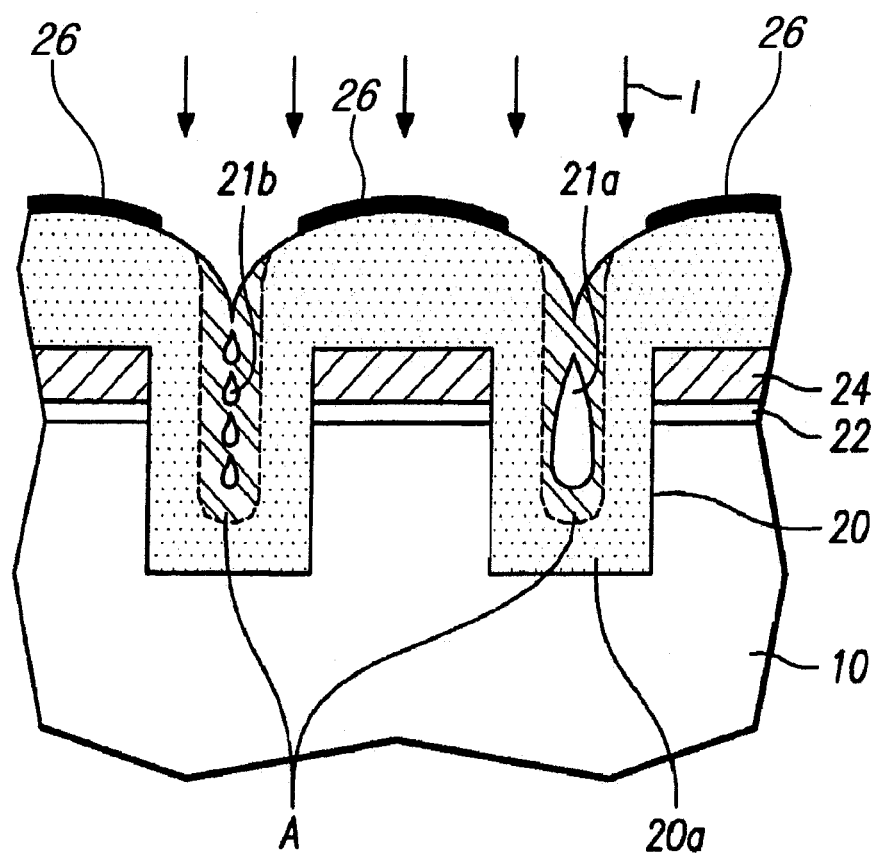

FIG. 2A shows a cross-sectional view of a shallow trench isolation structure, wherein trenches 20 are formed in a substrate 10, and then are filled with a first filling oxide 20a. Namely, a pad oxide 22 and a pad nitride 24 are formed on the substrate 10 in successive order. Then, a moat pattern (i.e., a photoresist pattern) is formed by a photolithography process. The moat pattern defines openings over regions of the substrate 10, the pad oxide 22, and the pad nitride 24 in which a trench structure 20 may be formed. Subsequently, after the pad nitride 24 and the pad oxide 22 are etched, the exposed portion of the substrate 10 is also etched in a predetermined depth so that trenches 20 are formed. Further, trenches 20 are filled with the first filling oxide 20a. Before the first filling process, a liner oxide is preferably formed on the sidewall of trench 20 by an oxidation process. After the liner oxidation, the first filling oxide 20a is formed in trenches 20 and over the entire substrate by $O_3$-TEOS CVD or HDP-CVD. Here, if the width of the trench 20 is narrow, voids 21a or seams 21b may occur in the first filling oxide 20a, as shown in FIG. 1.

Referring to FIG. 2A, impurities (I) are injected into the first filling oxide 20a inside the trench 20. For example, impurities such as phosphorus (P), boron (B), argon (Ar), etc., commonly used in an implantation process for the manufacture of a semiconductor device, can be injected in the first filling oxide 20a, thus changing the network structure thereof. Especially, in the impurity implantation, the concentration and implantation energy of the impurities can be controlled so that the injected impurities are restricted in an area (A) of the first filling oxide 20a. Here, because the active device area is protected by the pad nitride 24, the impurities cannot be injected into the active device area below the pad nitride 24. For the purpose of more effective protection of the active device area, it is preferable that the impurity implantation into the active device area is blocked by a photoresist mask 26 covering the active device area (see FIG. 2A').

Figure 2B:
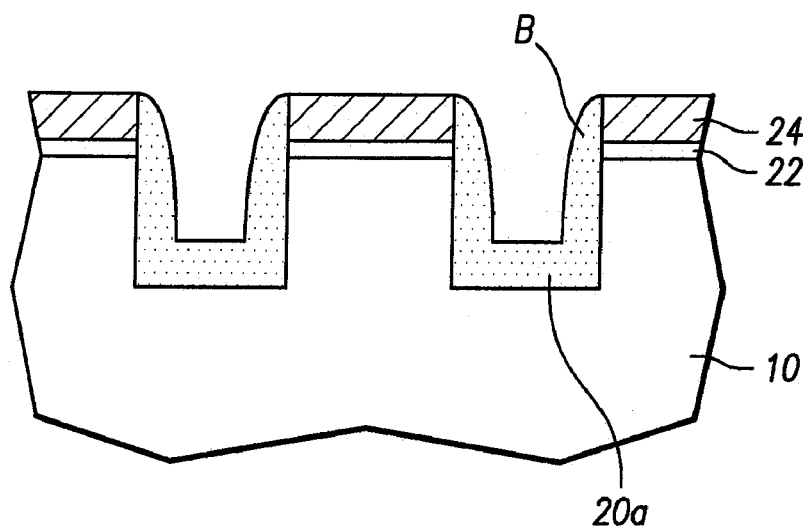

Since the impurities can be mostly injected in the area (A) where voids 21a and seams 21b may occur, the structure of the first filling oxide 20a in vicinity of the area (A) can be changed. As a result, the structure-changed area (A) has a relatively high etching rate, in comparison with other portions of the first filling oxide 20a in which the impurities are rarely injected. In a subsequent wet etching process using hydrofluoric acid (HF) or buffered HF, the structure-changed area (A) can be primarily etched so that an oxide sidewall indicated as B is formed in the trench 20, as shown in FIG. 2B.

Figure 2C:
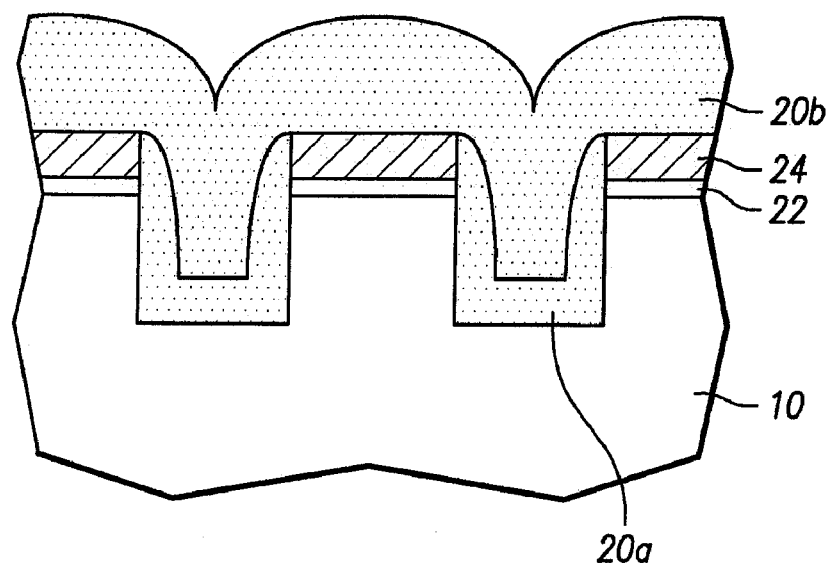

After the formation of the oxide sidewall (B), an additional oxide as a second filling oxide 20b is formed in the trench 20 by $O_3$-TEOS CVD or HDP-CVD. The additional filling of the trench 20 can be easily performed, because the oxide sidewalls (B) in the trench 20 have a positive slope, i.e., a tapered shape as shown in FIG. 2B. Consequently, as shown in FIG. 2C, trenches 20 can be completely filled with the first filling oxide 20a and the second filling oxide 20b, without voids and seams.

Meanwhile, the second filling oxide 20b also covers the active device areas, and it should be selectively removed for device processing to continue. This is accomplished by planarizing the substrate 10, typically via chemical-mechanical polishing (CMP), using the pad silicon nitride 24 over the active area as a stop layer. This process removes the second filling oxide 20b from the active device areas while retaining it in the isolation trenches. The pad nitride 24 and pad oxide 22 are then removed, resulting in isolated device regions without voids or seams therein.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming shallow trench isolation in a semiconductor device, comprising the steps of:
   (a) forming a trench of a predetermined depth in a semiconductor substrate;
   (b) filling the trench with a first filling oxide, then forming a photoresist mask on the first filling oxide covering an active device area;
   (c) implanting an impurity into a central portion of the first filling oxide inside the trench, while the photoresist mask is covering the active device area;
   (d) removing the implanted portion of the first filling oxide, by wet etching after implanting the impurity into the central portion of the first filling oxide; and
   (e) filling the trench with a second filling oxide.

2. The method of claim 1, wherein the first filling oxide is a silicon oxide.

3. The method of claim 1, wherein the second filling oxide is a silicon oxide.

4. The method of claim 2, wherein the first and second filling oxides are formed by $O_3$-TEOS (Tetra Ethyl Ortho Silicate) chemical vapor deposition.

5. The method of claim 2, wherein the first and second filling oxides are formed by high-density plasma chemical vapor deposition.

6. The method of claim 3, wherein the first and second filling oxides are formed by $O_3$-TEOS (Tetra Ethyl Ortho Silicate) chemical vapor deposition.

7. The method of claim 3, wherein the first and second filling oxides are formed by high-density plasma chemical vapor deposition.

8. The method of claim 1, wherein the impurity injected into the portion of the first filling oxide is any one selected from the group consisting of phosphorus (P), boron (B), and argon (Ar).

9. The method of claim 1, wherein the semiconductor substrate is a silicon substrate.

\* \* \* \* \*